(12) United States Patent
Siemons et al.

(10) Patent No.: US 11,860,549 B2
(45) Date of Patent: Jan. 2, 2024

(54) METHOD FOR CONTROLLING A MANUFACTURING APPARATUS AND ASSOCIATED APPARATUSES

(71) Applicant: ASML NETHERLANDS B.V., Veldhoven (NL)

(72) Inventors: Wolter Siemons, Veldhoven (NL); Daan Maurits Slotboom, Wolphaartsdijk (NL); Erik Peter De Kort, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/251,419

(22) PCT Filed: May 1, 2019

(86) PCT No.: PCT/EP2019/061136
§ 371 (c)(1),
(2) Date: Dec. 11, 2020

(87) PCT Pub. No.: WO2019/242922
PCT Pub. Date: Dec. 26, 2019

(65) Prior Publication Data
US 2021/0247700 A1 Aug. 12, 2021

(30) Foreign Application Priority Data

Jun. 19, 2018 (EP) .................................... 18178397
Oct. 1, 2018 (EP) .................................... 18197882

(51) Int. Cl.
*G03F 7/00* (2006.01)
(52) U.S. Cl.
CPC ...... *G03F 7/70633* (2013.01); *G03F 7/70725* (2013.01)

(58) Field of Classification Search
CPC .......................... G03F 7/70475; G03F 7/70633
See application file for complete search history.

(56) References Cited

U.S. PATENT DOCUMENTS 5,973,766 A * 10/1999 Matsuura ............ G03F 7/70425
430/22
6,309,944 B1 * 10/2001 Sheng ...................... H01L 22/26
438/18
(Continued)

FOREIGN PATENT DOCUMENTS

| CN | 106463434 | 2/2017 |
| KR | 20130032120 | 4/2013 |

(Continued)

OTHER PUBLICATIONS

International Search Report and Written Opinion issued in corresponding PCT Patent Application No. PCT/EP2019/061136, dated Jul. 30, 2019.
(Continued)

*Primary Examiner* — Steven Whitesell Gordon
(74) *Attorney, Agent, or Firm* — Pillsbury Winthrop Shaw Pittman, LLP

(57) ABSTRACT

A method for determining a correction for control of at least one manufacturing apparatus used in a manufacturing process for providing structures to a region on a substrate, the region including a plurality of sub-regions. The method includes obtaining measurement data relating to a process parameter of the manufacturing process for the region; and determining a correction for the manufacturing apparatus based on the measurement data. The correction is configured to maintain the process parameter within a specified range across a boundary between two of the sub-regions and/or to better correct the process parameter across the boundary between two of the sub-regions with respect to within the remainder of the region.

20 Claims, 4 Drawing Sheets

(56) References Cited

U.S. PATENT DOCUMENTS

| | | | |
|---|---|---|---|
| 6,362,491 B1 * | 3/2002 | Wang | G03F 7/70475 250/548 |
| 2006/0066855 A1 | 3/2006 | Boef et al. | |
| 2009/0262319 A1 * | 10/2009 | Matsuura | G03F 7/70791 355/53 |
| 2011/0027704 A1 | 2/2011 | Cramer et al. | |
| 2011/0043791 A1 | 2/2011 | Smilde et al. | |
| 2011/0096309 A1 | 4/2011 | Wiaux et al. | |
| 2011/0102753 A1 | 5/2011 | Van De Kerkhof et al. | |
| 2012/0044470 A1 | 2/2012 | Smilde et al. | |
| 2012/0082937 A1 | 4/2012 | Fabinski et al. | |
| 2012/0123581 A1 | 5/2012 | Smilde et al. | |
| 2013/0258310 A1 | 10/2013 | Smilde et al. | |
| 2013/0271740 A1 | 10/2013 | Quintanilha | |
| 2017/0046473 A1 | 2/2017 | Fouquet et al. | |
| 2017/0248852 A1 | 8/2017 | Warnaar et al. | |
| 2017/0255112 A1 | 9/2017 | Van Leest et al. | |
| 2018/0024444 A1 * | 1/2018 | Coskun | G03F 7/70633 355/67 |
| 2018/0314149 A1 | 11/2018 | Mulkens | |

FOREIGN PATENT DOCUMENTS

| | | |
|---|---|---|
| KR | 20150129414 | 11/2015 |
| TW | 201709108 | 3/2017 |
| TW | 201727357 | 8/2017 |
| TW | 201734632 | 10/2017 |
| TW | 201741777 | 12/2017 |
| TW | 201741779 | 12/2017 |
| WO | 2009078708 | 6/2009 |
| WO | 2009106279 | 9/2009 |
| WO | 2013178422 | 12/2013 |

OTHER PUBLICATIONS

Taiwanese Office Action issued in corresponding Taiwanese Patent Application No. 108117022, dated Mar. 27, 2020.

"Method for in-die overlay control in case of combining multiple lithographically exposed images into a single image", Research Disclosure, Kenneth Mason Publications, vol. 651, No. 16, May 29, 2018.

Korean Office Action ssued in corresponding Korean Patent Application No. 10-2020-7036686, dated Aug. 24, 2022.

Office Action issued in Chinese Patent Application No. 201980041201.7, dated Jul. 15, 2023.

Office Action issued in Korean Patent Application No. 10-2020-7036686, dated Jun. 20, 2023.

* cited by examiner

METHOD FOR CONTROLLING A MANUFACTURING APPARATUS AND ASSOCIATED APPARATUSES

CROSS-REFERENCE TO RELATED APPLICATIONS

This application is the U.S. national phase entry of PCT Patent Application No. PCT/EP2019/061136, which was filed on May 1, 2019, which is claims the benefit of priority of European Patent Application No. 18178397.81 which was filed on Jun. 19, 2018, and of European Patent Application No. 18197882.6, which was filed on Oct. 1, 2018, each of which is incorporated herein in its entirety by reference.

BACKGROUND

Field of the Invention

The present invention relates to methods and apparatus for applying patterns to a substrate in a lithographic process.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention, there is provided a method for determining a correction for control of at least one manufacturing apparatus used in a manufacturing process for providing structures to a region on a substrate, said region comprising a plurality of sub-regions; the method comprising: obtaining measurement data relating to a process parameter of the manufacturing process for the region; and determining a correction for the manufacturing apparatus based on said measurement data, wherein said correction is configured to better correct the process parameter across the boundary between two of said sub-regions with respect to within the remainder of the region.

In a second aspect of the invention, there is provided a processing device for determining a correction for control of at least one manufacturing apparatus configured to provide product structures to a substrate in a manufacturing process, the processing device being configured to perform the method of the first aspect.

In a third aspect of the invention, there is provided a computer program comprising program instructions operable to perform the method of the first aspect when run on a suitable apparatus.

In a fourth aspect of the invention, there is provided a manufacturing apparatus configured to provide product structures to a substrate in a manufacturing process, said manufacturing apparatus comprising the processing device of the second aspect.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
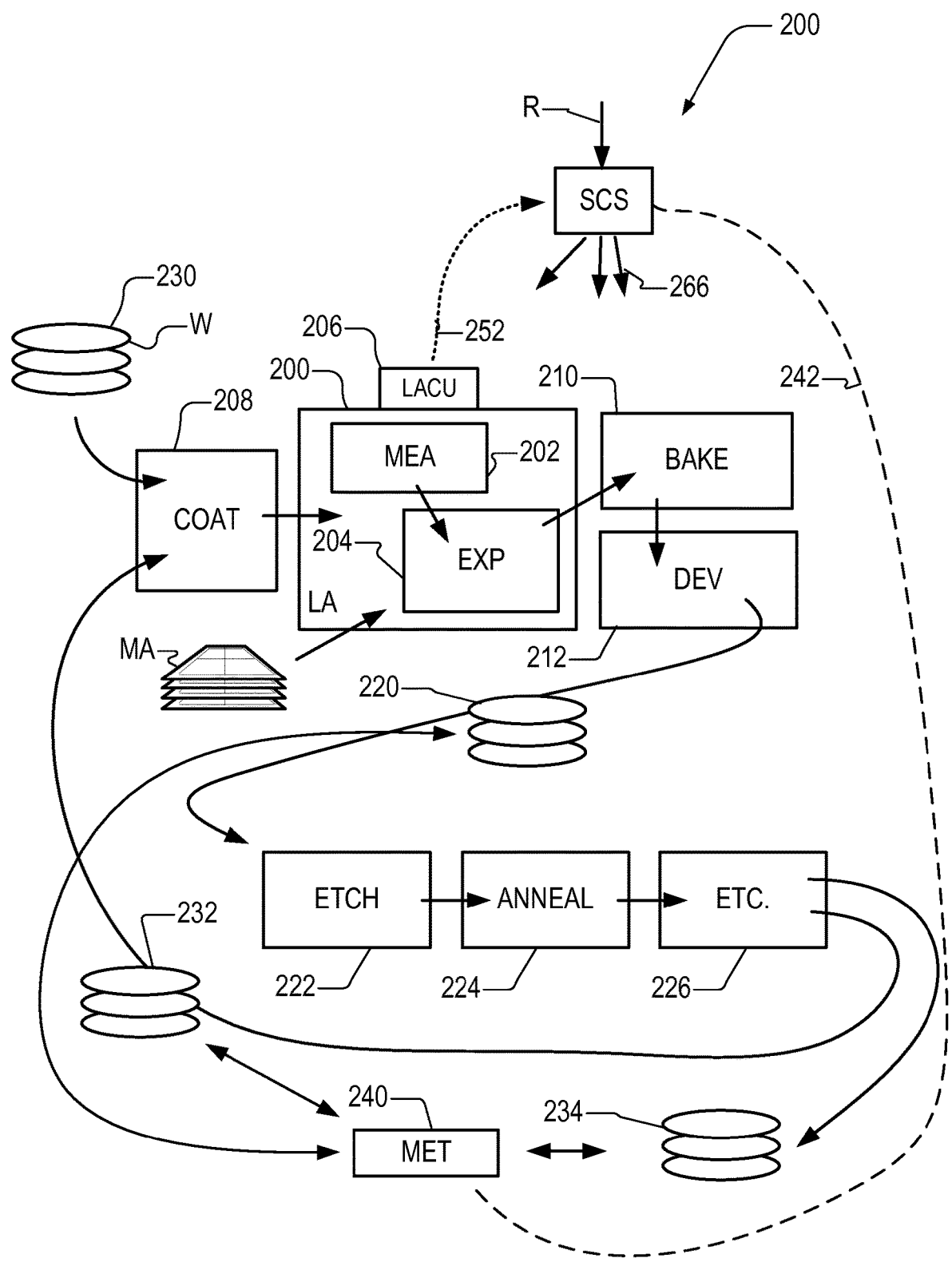
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200.

At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(a). This is purely an example metrology apparatus and any suitable metrology apparatus for measuring a process parameter such as overlay on a substrate may be used. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 2:
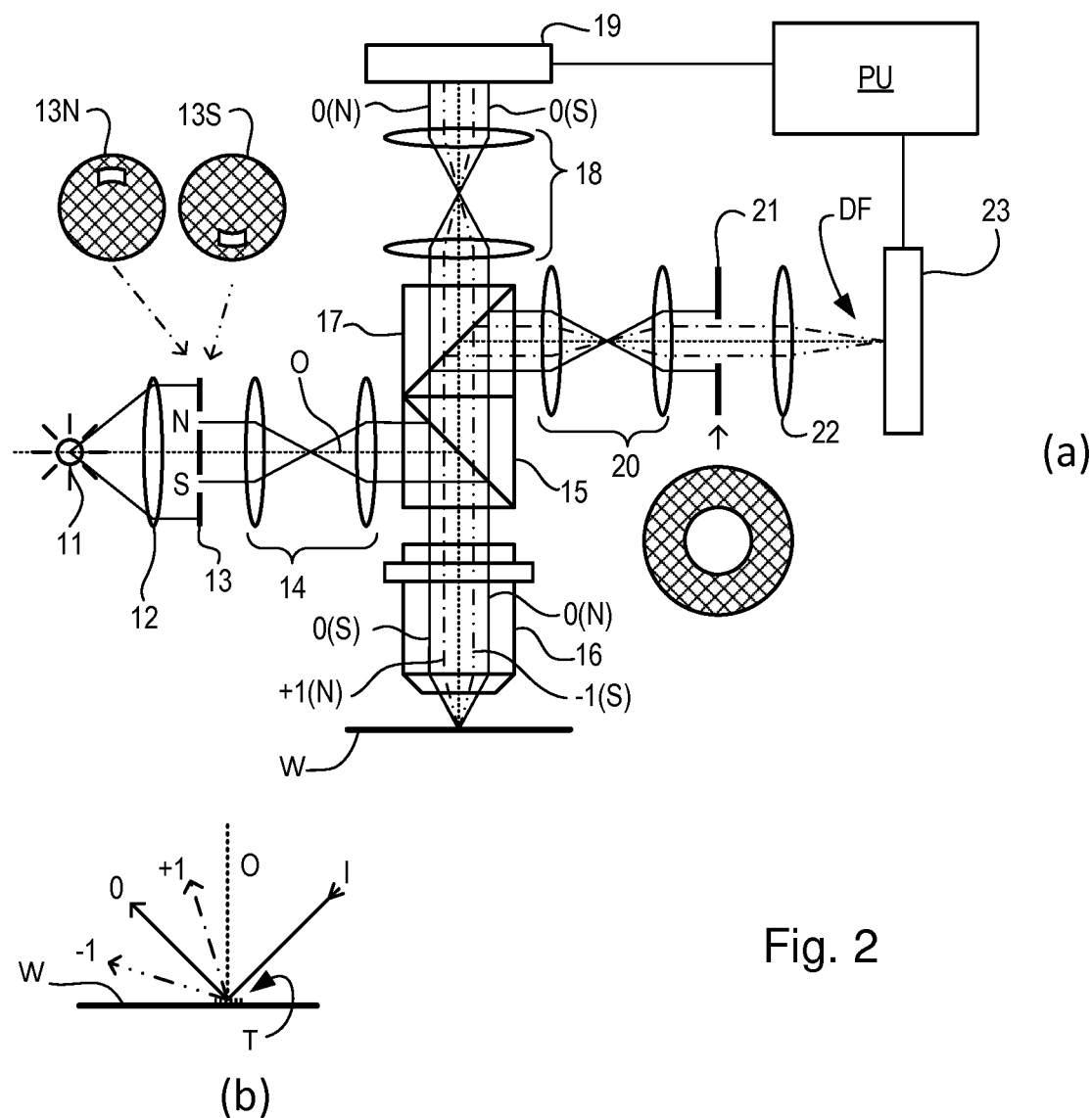
FIG. 2 comprises a schematic diagram of a scatterometer for use in measuring targets according to embodiments of the invention.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process The largest area which can be exposed in a single exposure of a lithographic apparatus is defined by its maximum scanning field area. This is defined by the width of the exposure slit in a first direction (often designated the x-direction) and the maximum scan length in the orthogonal direction of the same (substrate) plane (often designated the y-direction). In some cases, the die area (the substrate area of the device being manufactured, referred to herein as the substrate field area or substrate region area) is larger than the maximum scanning field area. In this situation, some or all layers of the device need to be exposed on the substrate region (or substrate field) in multiple (e.g., two) separate adjacent exposures. For example: a substrate region twice as large as the maximum scanning field area may be exposed in two exposures: a first exposure using a first reticle comprising a first pattern is used to print a first substrate sub-region (e.g., first half in terms of area on the substrate) of the layer, and a second reticle comprising a second pattern is used to print a second sub-region of the layer (e.g., the second half) on the substrate, adjacent the first half therefore forming the complete layer. The two halves can be referred to as having been "stitched" together, with the process sometimes referred to as intra-die stitching.

As already discussed, one or more performance parameters, such as overlay, are measured using a metrology device on processed substrates and process corrections are determined which aim to minimize the overlay error for subsequent substrates and/or subsequent layers of the same substrate. The process corrections are typically implemented by the lithographic apparatus in a feedback loop.

For a stitched die, the overlay corrections for the layer comprising the two (or more) images to be stitched may be determined by measuring overlay on the preceding (underlying) layer (or from a previous substrate) and splitting these corrections between the corresponding sub-regions (e.g., two halves), such that the corrections for each sub-region of the full field are determined respectively from measurements on the corresponding sub-region in the previous layer.

Overlay corrections may be determined as coefficients (sometimes referred to as k-parameters) for a polynomial in a best fit method such that a correction based on the polynomial minimizes the measured overlay (e.g., on average over the fitted area) when applied. The determined k-parameters may be fed back to the lithographic apparatus in the form of a sub-recipe characterized by the k-parameters. Because the corrections for each sub-region of the substrate field are calculated separately, the overlay corrections at the interface of the sub-regions (i.e., the stich) are not matched by default. This means that an overlay or matching error could be introduced when stitching the two sub-regions together.

Overlay at the stitch is also influenced by the use of a limited number of measurement points (targets) available. This typically results in the overlay correction being optimized only to the points measured, often at the expense of the overlay at unmeasured locations (e.g., including the stitch region). It is possible to provide for "stitched targets" for direct measurement of overlay at the stitched region. This may comprise providing a first half of an overlay target on the first sub-region (e.g., patterned from the first reticle) and a second (complementary) half of the overlay target on the second sub-region (e.g., patterned from the second reticle). Of course, this is only possible where there is sufficient space on the reticle/die. Measurement of the position of one half of the target with respect to the other half provides an indication of a relative positioning metric referred to herein as "stitched overlay" (not true overlay as it relates to relative positioning within a single layer). When calculating overlay corrections, knowledge of which marks are conventional overlay targets and which ones are stitched targets is required, as, when calculating overlay corrections, these two target types need to be treated differently. A mixture of stitched and conventional target types is envisaged herein, according to an optional embodiment. In addition, the concepts may be combined into a stitched overlay target which has a grating or similar structure in a first layer overlaid with the two stitch target halves. This allows measurement of conventional overlay in the stich region in addition to "stitched overlay".

Figure 3:
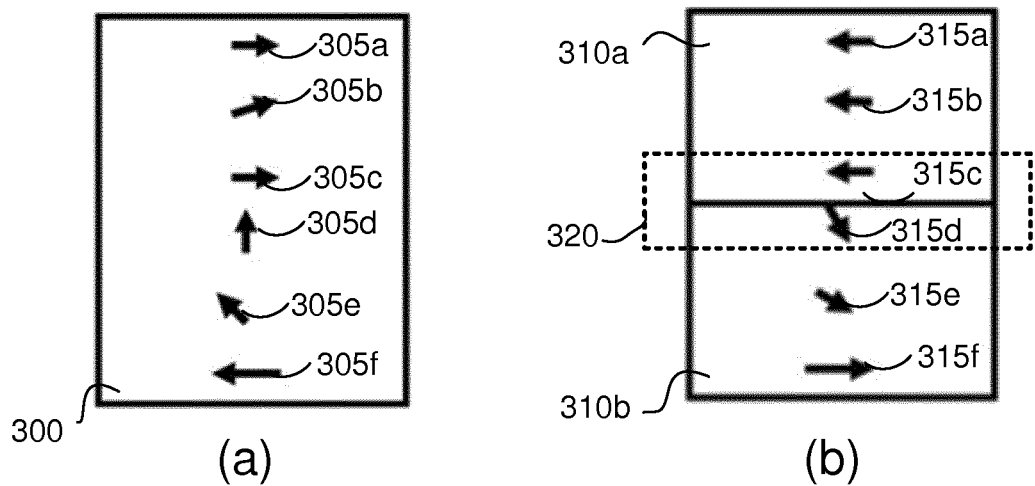
FIG. 3 comprises a schematic diagram of (a) a region on a substrate with measured overlay vectors illustrated; (b) the corresponding sub-regions of a subsequent layer with correction vectors illustrated, as determined by a prior art strategy; and (c) corresponding sub-regions of a subsequent layer with correction vectors illustrated, as determined by a method according to an embodiment of the invention.

FIG. 3(a) is a schematic example of overlay (as represented by the vectors 305a-305f) measured on a full substrate field (substrate region) 300. A subsequent layer is exposed over the field 300, in two exposures, each exposure defining a sub-region (sub-field or half-field). This may be because the maximum scanning field area of the lithographic apparatus may be smaller than the required substrate field are for a particular die (required die size). FIG. 3(b) shows the subsequent two stitched sub-regions 310a, 310b. The vectors 315a-315f represent the corresponding corrections (as actuated) for the measured overlay 305a-305f according to a known method. In such a known method, overlay correction for the top sub-region 310a and bottom sub-region 310b are determined using only the measurements (i.e., vectors 305a-305c and 305d-305f respectively) relating to the corresponding sub-region of the full field 300. In this simplified example, the corrections for each sub-region are represented by only three vectors (in reality there would be more measurements, e.g., as defined by the number of overlay targets). Corrections for overlay are typically determined per field; and may be based on a minimization of an average or maximum overlay error across the field. Also, once corrections are determined, the degree to which they can be actuated is limited in magnitude and frequency, as the reticle and wafer stages of the lithographic apparatus have only limited degrees of freedom; corrections can only be applied using fluid motions as the stages cannot suddenly change speed or direction. Therefore the overlay corrections cannot be determined nor actuated ideally and consequently there will always be an overlay residual over the region. In this example the correction vector 315d closest to the stitching boundary in the bottom sub-region 310b does not completely cancel out its corresponding overlay vector 305d. The result is an overlay residual at the stitching boundary area 320. However, the stitching boundary area may be the substrate field area for which overlay is most critical.

To address this, it is proposed is to impose an additional boundary condition when determining the corrections (e.g., when generating the sub-recipe correction parameters). The boundary condition increases the degree of matching between the overlay corrections either side of the boundary within the stitching boundary area and/or ensures better quality overlay corrections (i.e., a bias towards smaller or zero overlay residuals) within this boundary area.

In an embodiment, the boundary condition can either be strict; i.e., imposing that only a very minimal overlay error is allowed (e.g., by imposing a zero or very low error threshold within this boundary region). This approach ensures the best matching of the two sub-regions, but risks larger overlay errors elsewhere in the region. Therefore, whether this approach is justified should be evaluated on a per case basis. Alternatively, or in combination, the boundary condition may comprise an imposed weighting or weight factor, weighted in favor of corrections which minimize overlay within the boundary stitching area with respect to the remaining area of each sub-region. Such a weighting may comprise, for example, a constraint when fitting the correction polynomial which favors results which minimize overlay within the stitching boundary area with respect to the rest of the field. This approach (or a threshold approach with a less stringent threshold) potentially allows greater flexibility in determining corrections, which could be beneficial to the overlay in the rest of the region. In an embodiment, the boundary condition may be settable between a weighting approach or a boundary area threshold approach (or a combination thereof) and/or enable the weighting/threshold to be varied.

FIG. 3(c) shows the result of a strict boundary condition which imposes that there be no residual within the stitching boundary area 320 (i.e., the overlay vectors 305c and 305d are perfectly cancelled by respective correction vectors 325c and 325d. The trade-off is that the correction vectors 325a, 325b, 325e, 325f may be less effective at correcting the overlay vectors 305a, 305b, 305e, 305f compared to the correction vectors 315a, 315b, 315e, 315f. In particular, it can be seen that correction vector 325f is a visibly notably poorer correction than corresponding correction vector 315f.

Figure 4:
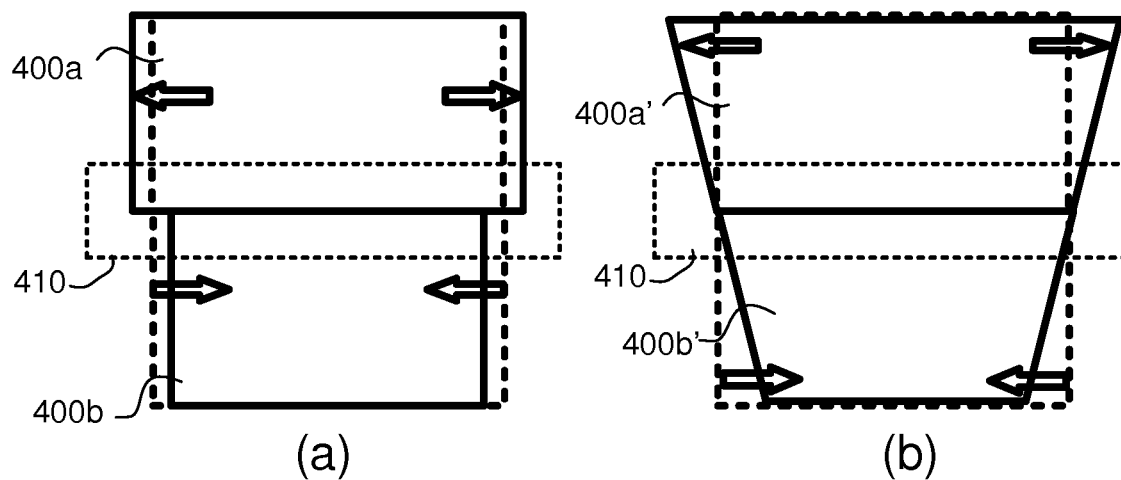
FIG. 4 comprises a schematic diagram of (a) sub-regions on a substrate with a representation of a correction determined by a prior art strategy; and (b) sub-regions on a substrate with a representation of a correction determined by a method according to an embodiment of the invention.

FIG. 4 illustrates a similar example of the methodology described herein. FIG. 4(a) shows an example present correction strategy, where the correction determined for the top sub-region 400(a) comprises a magnification in the x-direction greater than 1 and the correction determined for the bottom sub-region 400(b) comprises a magnification in the x-direction smaller than 1. The result is an overlay discontinuity within the stitching boundary area 410. FIG. 4(b) shows the result of imposing a boundary condition as described. The determined correction recipes will tend to avoid recipes with larger overlay errors within the stitching boundary area 410, thereby mitigating the discontinuity within the stitching boundary area 410. Such a correction, for example, may comprise a trapezoid shaped (x-direction) magnification correction over the two sub-fields 400(a)', 400(b)', as illustrated. The trade-off may be increased overlay residuals across the individual fields, away from the stitching boundary area 410.

Figure 5:
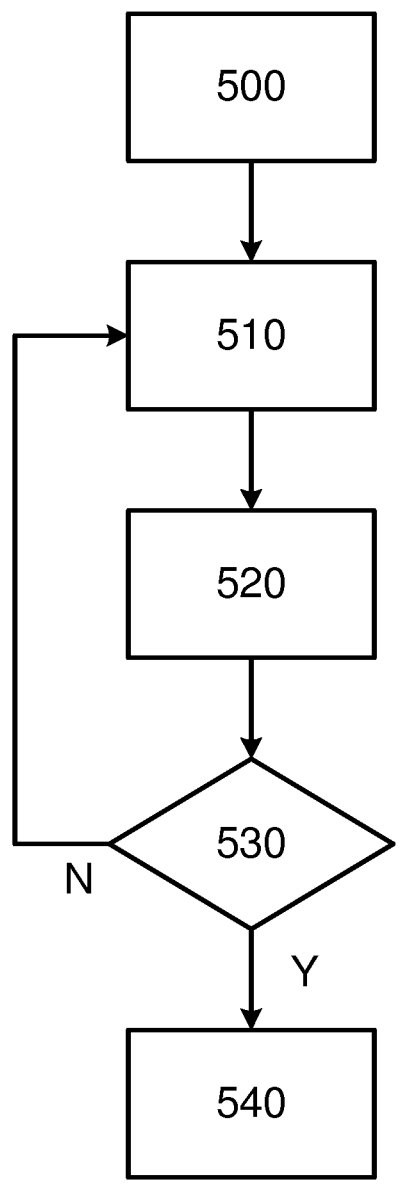
FIG. 5 is a flowchart of a method of determining corrections for, and exposing in separate exposures, adjacent sub-regions on a substrate according to an embodiment of the invention.

FIG. 5 is a flowchart describing a method according to an embodiment. At step 500, overlay measurements are made on a substrate, said measurements including those relating to a region on the substrate onto which a die will be exposed in two (or more) separate adjacent exposures. For example, the required die area may be larger than a maximum scanning field area of the lithographic apparatus. At optional step 510, a boundary condition strategy may be selected. The boundary condition may be based on (for example) a threshold based strategy (setting a maximum residual value within the boundary area), a zero residual strategy (allowing no residual within the boundary error) and/or a weighting based strategy (applying a constraint favoring results which tend toward minimal residual in the boundary area). This step may also comprise setting the degree of weighting and/or any threshold value (as appropriate). In an alternative embodiment, the strategy may be predetermined and/or fixed and this step not performed. At step 520, separate corrections are determined for the exposure of each sub-region, taking into account the boundary condition imposed. Optional step 530 may model and evaluate the result of the corrections determined at step 520. In an embodiment, this step may determine whether the die is yielding. If it is determined at this step that the die may be non-yielding; i.e., overlay is out of specification either according to the (more stringent) specification within the stitching boundary area or the specification elsewhere on the die, then the method may return to step 510 and an alternative boundary condition strategy may be selected. Finally, at step 540, the two adjacent sub-regions are exposed in separate exposures based on their respective corrections.

The control routine described above is described in terms of optimizing overlay corrections for the case when two or multiple sub-regions, each of which requires an individual exposure, are stitched together to cover a larger exposure field area (or full field area, maximum scanning field area) in a layer on the substrate. An extension of the basic concept will now be described. This comprises an optimization routine applicable for exposing a subsequent layer (e.g., covering a full exposure field area) over the stitched exposure (e.g., comprising a first and second sub-region) in the previous layer. This may occur, for example, when different apparatuses, each having different maximum scanning field areas, are used to expose the two layers.

As such, disclosed is a method for determining a correction for control of a manufacturing process for providing structures to a region (defined by a maximum scanning field area), the region comprising a plurality of sub-regions; the method comprising obtaining measurement data relating to a process parameter of the manufacturing process for the region; and determining a correction for the manufacturing apparatus providing structures to said region on the substrate based on a separate consideration for each of said plurality of sub-regions. The correction may comprise a second layer correction for control of the manufacturing process for forming second layer structures in a second on said region, wherein each of the sub-regions corresponds with a separately exposed sub-region in a first layer.

In such an embodiment, the single exposure field area (e.g. required die size) in the subsequent layer may be equal to the combined field area of the (e.g., stitched) sub-regions in the previous layer. In this case, overlay corrections may be determined which take into account the division of the full field area into sub-regions in the previous layer.

It will be apparent that the sub-regions of a stitched die may not be perfectly positioned and/or oriented with respect to each other and/or other layers. For example, one or both sub-regions may have a tilt error or a magnification error with respect to a desired orientation or magnification; this tilt or magnification may be the same or different for the two sub-regions. Therefore, correction capabilities are proposed which are configured to better match full field exposure layers to partial field exposure layers. Such a method may comprise obtaining metrology data describing the relative positioning and orientation of the sub-fields (e.g. alignment data, overlay data) relating to a first layer. The metrology data may comprise determining the sub-fields' relative orientation and magnification via classical metrology with respect to an underlying layer, or directly via stitching methods (e.g., measurement of stitching targets).

A lithographic apparatus interface should be defined or provided which allows definition of a substrate grid in a second (subsequent) layer to be matched to the previous layer at the sub-field level. An algorithm may then generate a full-field control recipe for the second layer (based on the metrology data) such that the implemented full-field control optimally matches with the substrate sub-grids (grids for each sub-field) of the first layer. For example, the correction may be determined based on a direct optimization of the sub-field control profile, e.g., a separate minimization of an average or maximum (e.g., overlay) error/residual across each sub-region of the full scanning field.

As an alternative to direct optimization, a correction method for a second layer may be based on a definition of a boundary area. The boundary area may or may not coincide with the boundary area defined in the previous (stitched) layer. In one embodiment, the boundary area may define an evaluation zone (or sub-field, sub-region) which, as before, may be around and/or centered on the interface between two sub-regions in the previous layer. This method may comprise explicitly optimizing the corrections within the stitching boundary area. As such, the overlay corrections in the second layer may be determined in accordance with the three areas (the two sub-regions and the boundary area). As with the previous embodiments, a boundary condition (e.g., threshold condition and/or weighting) may be imposed when determining the correction for the second layer. In another embodiment, it may be proposed not to take into account the boundary area when determining the corrections for the second layer, such that there is a more fluid control across the two sub-fields; the boundary area being potentially subject to different orientations and/or magnifications resultant from the respective sub-field exposures. This is essentially similar to the previous example, but with a zero weighting boundary condition given to the boundary area.

While the above description is described in terms of measuring overlay in an earlier layer for determining corrections for subsequent layers on the same substrate, the concept is equally applicable to measuring overlay on previous substrates and using these measurements to determine corrections (for the same layer or other layers) on subsequent substrates (of the same lot or for subsequent lots). Corrections could also be determined based on a combination of measurements from preceding layers of the same substrate and measurements from previous substrates. More generally, in addition to overlay, the concepts described herein can also be used for measurement and monitoring of other relevant processing parameters such as edge placement error. Another process parameter which may be measured and monitored is "stitched overlay". This is not overlay in the conventional sense, as it relates to matching within a single layer. Instead, this stitched overlay is a relative positional metric describing the relatively positioning of the two sub-regions with respect to each other. The abovementioned "stitched targets" and/or "stitched overlay targets" may be provided and measured to do this. It may also be appreciated that the two sub-regions may be overlapping (at least partially) in the stitching boundary area to form a complete "stitched target" and/or "stitched overlay target". For example, a box-in-box type arrangement may comprise a first image of a box in the first sub-region being formed inside a second image of a box in the second sub-region, the two sub-regions overlapping in the boundary area where the stitched target is formed. Alternatively, the two images may each comprise grating structures which are designed to be interlaced when imaged at the boundary area. Misalignment of such an interlaced target would manifest as asymmetry which could then be measured similarly to overlay targets. Such a stitched target may be formed over another grating in another layer (or another grating formed over it) to provide for a stitched overlay target.

Further embodiments of the invention are disclosed in the list of numbered embodiments below:
1. A method for determining a correction for control of at least one manufacturing apparatus used in a manufacturing process for providing structures to a region on a substrate, said region comprising a plurality of sub-regions; the method comprising:
    obtaining measurement data relating to a process parameter of the manufacturing process for the region; and
    determining a correction for the manufacturing apparatus based on said measurement data, wherein said correction is configured to maintain the process parameter within a specified range across a boundary between two of said sub-regions and/or to better correct the process parameter across the boundary between two of said sub-regions with respect to within the remainder of the region.
2. A method according to embodiment 1, wherein said determination comprises applying a boundary condition which favors a correction that better minimizes process parameter errors across the boundary with respect to process parameter errors inside the sub-regions.
3. A method according to embodiment 2, wherein said step of applying a boundary condition comprises imposing an error threshold for said process parameter across said boundary, such that said determined correction ensures process parameter errors across the boundary do not exceed the error threshold.
4. A method according to embodiment 3, wherein said error threshold is zero, such that said determined correction ensures that said process parameter error across the boundary has a minimum achievable value.
5. A method according to embodiment 4, wherein said method comprises defining a value for the error threshold before the step of determining a correction.
6. A method according to any of embodiments 2 to 5, wherein said step of applying a boundary condition comprises imposing a weighting constraint, the weighting constraint applying a weighting in favor of a correction which minimizes process parameter errors across the boundary between two sub-regions with respect to within the remainder of the region.
7. A method according to embodiment 6, wherein said method comprises defining the weighting constraint before the step of determining a correction.
8. A method according to any of embodiments 2 to 7, wherein said method comprises: assessing whether the manufacturing process will be yielding, and
    amending said boundary condition if the manufacturing process is assessed to be non-yielding.
9. A method according to any of embodiments 2 to 8, wherein said determining a correction comprises determining coefficients for a polynomial which minimizes the error over said region while respecting the boundary condition.
10. A method according to any preceding embodiment, wherein said manufacturing process provides said product structures on said substrate in a plurality of exposures, each exposure defining a respective one of said sub-regions, said sub-regions being exposed adjacently to define said region.
11. A method according to embodiment 10, wherein the region has an area larger than a maximum scanning field area of the manufacturing apparatus.
12. A method according to embodiment 11, wherein each sub-region has an area defined by the maximum scanning field area of the manufacturing apparatus.
13. A method according to any preceding embodiment, wherein the process parameter comprises overlay or edge placement error.
14. A method according to any preceding embodiment, wherein the measurement data relates to a previously applied layer of the same substrate.
15. A method according to any preceding embodiment, wherein the measurement data relates to a corresponding layer of an earlier processed substrate.
16. A method according to any preceding embodiment, wherein said plurality of sub-regions comprise two sub-regions of equal area.
17. A method according to any preceding embodiment, comprising controlling the manufacturing process using said correction, wherein the correction is applied by the manufacturing apparatus when applying a layer of product structures onto the region of the substrate.
18. A method according to embodiment 17, wherein said layer of product structures is applied on said substrate in a plurality of exposures, each exposure defining a respective one of said sub-regions.
19. A method according to any preceding embodiment, wherein across the boundary between the two sub-regions is defined as within a boundary area, said boundary area comprising an area within said two sub-regions and extending either side of the boundary.
20. A method according to any preceding embodiment, wherein said measurement data relates to measurement of a plurality of targets within the region or a corresponding region; said plurality of targets comprising overlay targets and, in the vicinity of the boundary, at least one stitched target, wherein said stitched target comprise complementary patterns in each of said two sub-regions from which a relative positioning metric of the two sub-regions can be measured.
21. A method according to embodiment 20 wherein the stitched target is formed with a further pattern in a layer beneath or overlaying said stitched target to enable determination of overlay in addition to the relative positioning metric.
22. A method according to any preceding embodiment, wherein said structures are formed in a first layer, and said method further comprises:
determining second layer corrections for control of the manufacturing process based on a separate consideration for each of said plurality of sub-regions, said second layer corrections for providing second layer structures to said region on the substrate in a second layer.
23. The method according to embodiment 22, further comprising:
forming said second layer structures in a single exposure using said second layer corrections.
24. A method according to embodiment 22 or 23, wherein separate control grids are defined for each of said plurality of sub-regions, the second layer corrections being defined separately for the separate control grids.
25. A method according to embodiment 22, 23 or 24, comprising defining a second layer boundary area; and applying a boundary condition for corrections corresponding to said second layer boundary area.
26. A method according to embodiment 25, wherein the boundary condition optimizes the second layer corrections within the boundary area in preference to second layer corrections outside of the boundary area.
27. A method according to embodiment 25, wherein the boundary condition comprises not taking into account the boundary area when determining said second layer corrections.
28. A method for determining a correction for control of at least one manufacturing apparatus used in a manufacturing process for providing structures to a region on a substrate, said region being defined by a maximum scanning field area of the manufacturing apparatus, said region comprising a plurality of sub-regions; the method comprising:
  obtaining measurement data relating to a process parameter of the manufacturing process for the region; and
  determining a correction for the manufacturing apparatus for the providing of structures to said region on the substrate based on a separate consideration for each of said plurality of sub-regions.
29. The method according to embodiment 28, wherein said correction comprises a second layer correction for control of the manufacturing process and said structures comprise second layer structures formed on said region in a second layer.
30. The method according to embodiment 29, wherein each of said sub-regions corresponds with a separately exposed sub-region in a first layer.
31. The method according to embodiment 29 or 30, further comprising:
forming said structures in a single exposure using said correction.
32. A method according to any of embodiments 28 to 31, wherein separate control grids are defined for each of said plurality of sub-regions, the correction being defined separately for the separate control grids.
33. A method according to any of embodiments 28 to 32, comprising defining a boundary area around the boundary of two adjacent sub-regions of the plurality of sub-regions; and applying a boundary condition for corrections corresponding to said boundary area.
34. A method according to embodiment 33, wherein the boundary condition optimizes the correction within the boundary area in preference to the correction outside of the boundary area.
35. A method according to embodiment 33, wherein the boundary condition comprises not taking into account the boundary area when determining said correction.
36. A method according to any of embodiments 28 to 35, wherein said plurality of sub-regions numbers two.
37. A control recipe comprising a correction as determined by the method of any preceding embodiment.
38. A controller for a manufacturing apparatus configured to receive the control recipe of embodiment 37.
39. A processing device for determining a correction for control of at least one manufacturing apparatus configured to provide product structures to a substrate in a manufacturing process, the processing device being configured to perform the method of any of embodiments 1 to 36.
40. A manufacturing apparatus configured to provide product structures to a substrate in a manufacturing process, said manufacturing apparatus comprising the processing device according to embodiment 39.
41. A manufacturing apparatus according to embodiment 40, wherein the manufacturing apparatus comprises a lithographic apparatus having:
a substrate stage for holding a substrate;
a reticle stage for holding a patterning device;
a processor operable to control a manufacturing process using said correction.
42. A computer program comprising program instructions operable to perform the method of any of embodiments 1 to 36 when run on a suitable apparatus.
43. A non-transient computer program carrier comprising the computer program of embodiment 42.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining a correction for control of at least one manufacturing apparatus used in a manufacturing process for providing structures to a region on a substrate, the region comprising a plurality of sub-regions; the method comprising:
    obtaining measurement data relating to a process parameter of the manufacturing process for the region;
    determining, by a hardware computer, a first layer correction for the at least one manufacturing apparatus based on the measurement data, wherein the first layer correction is configured for application with respect to a boundary region and a remainder of at least one of the sub-regions and configured to better correct the process parameter across the boundary between two of the sub-regions with respect to within the remainder of the two sub-regions in providing structures to a first layer of the substrate and wherein the determining of an amount or type of first layer correction for the boundary region of the at least one sub-region is dependent on the determining of an amount or type of first layer correction for the remainder of the at least one sub-region or vice versa;
    determining a second layer correction for control of the manufacturing process based on a separate consideration for each of the plurality of sub-regions of the first layer, the second layer correction for providing second layer structures to the region on the substrate in a second layer and configured for a different size area than the first layer correction; and
    applying the first layer and/or second layer correction for control of the at least one manufacturing apparatus and/or outputting a signal representing, or based on, the first layer and/or second layer correction to a tool or system for enabling control of the at least one manufacturing apparatus.

2. The method as claimed in claim 1, wherein the determination comprises applying a boundary condition which favors a correction that better minimizes process parameter errors across the boundary with respect to process parameter errors inside the sub-regions.

3. The method as claimed in claim 2, wherein the applying a boundary condition comprises imposing an error threshold for the process parameter across the boundary, such that the determined correction ensures process parameter errors across the boundary do not exceed the error threshold.

4. The method as claimed in claim 2, wherein the applying a boundary condition comprises imposing a weighting constraint, the weighting constraint applying a weighting in favor of a correction which minimizes process parameter errors across the boundary between two sub-regions with respect to within the remainder of the region.

5. The method as claimed in claim 4, further comprising defining the weighting constraint before the determining a correction.

6. The method as claimed in claim 2, wherein the determining a correction comprises determining coefficients for a polynomial which minimizes the error over the region while respecting the boundary condition.

7. The method as claimed in claim 2, wherein the process parameter comprises overlay or edge placement error.

8. The method according to claim 1, further comprising forming the second layer structures in a single exposure using the second layer correction.

9. The method according to claim 1, wherein a separate control grid is defined for each sub-region of the plurality of sub-regions, the second layer correction being defined separately for the separate control grids.

10. The method according to claim 1, further comprising:
    defining a second layer boundary area; and
    applying a boundary condition for a correction corresponding to the second layer boundary area.

11. The method according to claim 10, wherein the boundary condition optimizes second layer correction within the boundary area in preference to second layer correction outside of the boundary area.

12. The method as claimed in claim 1, wherein the manufacturing process provides the product structures on the substrate in a plurality of exposures, each exposure defining a respective one of the sub-regions, the sub-regions being exposed adjacently to define the region.

13. A processing device for determining a correction for control of at least one manufacturing apparatus configured to provide product structures to a substrate in a manufacturing process, the processing device configured to perform the method of claim 1.

14. A manufacturing apparatus configured to provide product structures to a substrate in a manufacturing process, the manufacturing apparatus comprising the processing device according to claim 13.

15. The manufacturing apparatus according to claim 14, comprising a lithographic apparatus having:
    a substrate stage configured to hold a substrate;
    a stage configured to hold a patterning device; and
    a processor system configured to control a manufacturing process using the correction.

16. A non-transient computer program carrier comprising instructions therein, that when executed by a computer system, are configured to cause the computer system to at least:
    obtain measurement data relating to a process parameter of a manufacturing process for a region on a substrate, the manufacturing process for providing structures to the region, the region comprising a plurality of sub-regions;
    determine, based on the measurement data, a first layer correction for control of a manufacturing apparatus used in the manufacturing process, wherein the first layer correction is configured for application with respect to a boundary region and a remainder of at least one of the sub-regions and configured to better correct the process parameter across the boundary between two of the sub-regions with respect to within the remainder of the two sub-regions in providing structures to a first layer of the substrate and wherein the determination of an amount or type of first layer correction for the boundary region of the at least one sub-region is dependent on the determination of an amount or type of first layer correction for the remainder of the at least one sub-region or vice versa;

determine a second layer correction for control of the manufacturing process based on a separate consideration for each of the plurality of sub-regions of the first layer, the second layer correction for providing second layer structures to the region on the substrate in a second layer and configured for a different size area than the first layer correction; and cause application of the first layer and/or second layer correction for control of the at least one manufacturing apparatus and/or output a signal representing, or based on, the first layer and/or second layer correction to a tool or system for enabling control of the at least one manufacturing apparatus.

17. The carrier of claim 16, wherein the determination comprises application of a boundary condition which favors a correction that better minimizes process parameter errors across the boundary with respect to process parameter errors inside the sub-regions.

18. The carrier of claim 16, wherein the manufacturing process provides the product structures on the substrate in a plurality of exposures, each exposure defining a respective one of the sub-regions, the sub-regions being exposed adjacently to define the region.

19. A control recipe embodied on a non-transitory computer-readable medium, the recipe comprising a correction configured for receipt and application by a hardware system for control of at least one manufacturing apparatus used in a manufacturing process for providing structures to a region on a substrate, the region comprising a plurality of sub-regions, the correction configured for simultaneous application with respect to a boundary region and a remainder of at least one of the sub-regions and configured to better correct the process parameter across the boundary between two of the sub-regions with respect to within the remainder of the two sub-regions in providing structures to a first layer of the substrate and the correction configured for control of the manufacturing process in providing second layer structures to the region on the substrate in a second layer, the correction for the second layer based on a separate consideration for each of the plurality of sub-regions of the first layer and configured for a different size area than the correction for the first layer of the substrate.

20. A controller for a manufacturing apparatus, the controller configured to receive the control recipe of claim 19 and use the control recipe to control the manufacturing apparatus.

* * * * *